United States Patent [19]
Fujimoto

[11] Patent Number: 5,841,323
[45] Date of Patent: Nov. 24, 1998

[54] DIGITAL PLL USING PHASE AND FREQUENCY ERROR CALCULATING CIRCUITS

[75] Inventor: Kensuke Fujimoto, Kanagawa, Japan

[73] Assignee: Sony Corporation, Tokyo, Japan

[21] Appl. No.: 938,320

[22] Filed: Sep. 26, 1997

[30] Foreign Application Priority Data

Oct. 1, 1996 [JP] Japan ..................................... 8-260666

[51] Int. Cl.⁶ .................................................. H03L 7/087
[52] U.S. Cl. ................................ 331/11; 331/14; 331/18; 331/25
[58] Field of Search ................................ 331/11, 14, 18, 331/25

[56] References Cited

U.S. PATENT DOCUMENTS 4,069,462 1/1978 Dunn .......................................... 331/11
5,416,809 5/1995 Masuda et al. ............................ 331/11

*Primary Examiner*—Siegfried H. Grimm
*Attorney, Agent, or Firm*—Limbach & Limbach L.L.P.

[57] ABSTRACT

An A/D converter performs sampling of a reproduced signal from a reading device in synchronism with a clock signal from a PLL circuit and outputs the sampled value to a binary circuit and a phase comparator. The phase comparator detects a change from a positive sampled value to a negative one or from the negative sampled value to a positive one (zero-cross) and outputs a phase error signal corresponding to the zero-cross to a frequency comparator. The frequency comparator outputs a frequency error sensed in reference to a variation of the phase error signal to a switch through a low pass filter. The switch outputs the frequency error to an adder only when the PLL is not in a lock state. The adder outputs a sum of the frequency error and the phase error to a VCO through a loop filter. The VCO generates the clock signal with a frequency corresponding to the sum and supplies it to the A/D converter.

9 Claims, 11 Drawing Sheets

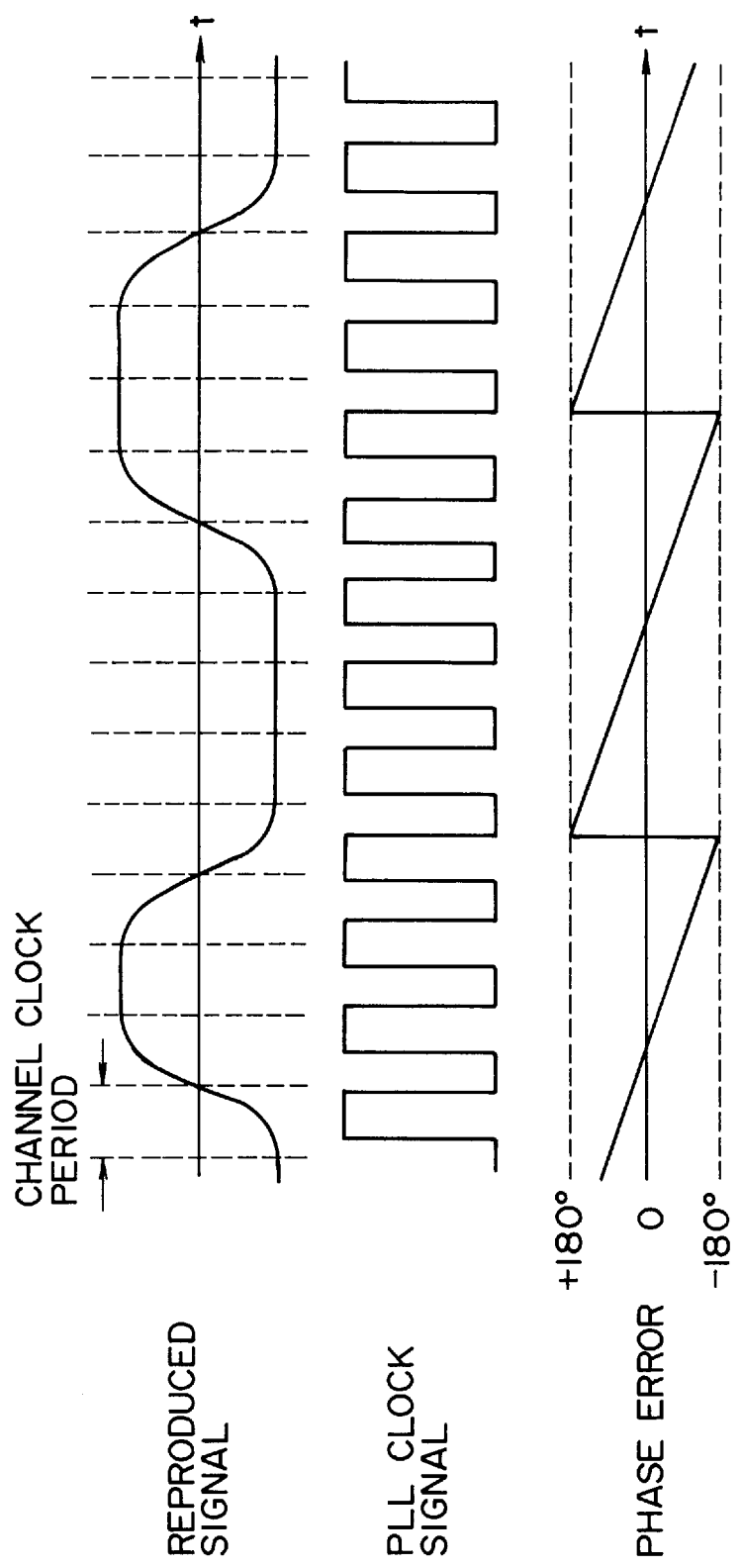

5,841,323

DIGITAL PLL USING PHASE AND FREQUENCY ERROR CALCULATING CIRCUITS

BACKGROUND OF THE INVENTION

1. Field of the Invention

This invention relates to a converter device, a converting method, a PLL calculating device and a PLL calculating method, and more particularly, a converter device, a converting method, a PLL calculating device and a PLL calculating method in which an analogue signal is sampled in synchronism with a clock signal, a digital signal corresponding to the analogue signal is generated, a phase error between the digital signal and the clock signal is calculated, a frequency error between the digital signal and the clock signal is calculated in reference to the phase error and then a clock signal is generated in correspondence with a sum of the phase error and the frequency error, thereby a capture range is expanded and then a leading-in time is shortened.

2. Description of the Prior Art

There has been widely distributed a recording medium for holding digital data represented by a compact disk and the like.

In the case that the digital data recorded in an optical disk and an optical-magnetic disk acting as a recording medium or the like is reproduced, a self-synchronization is frequently utilized in which the clock signal is extracted from the signal detected from the disk and then the digital data is reproduced from the detected signal in synchronism with the clock signal.

In addition, also in the receiver utilized in a digital data communication, there has been employed a system in which the clock signal is extracted from the received signal so as to perform a self-adjustment.

In such a self-synchronization as described above, the clock signal is extracted from the detected signal with a PLL (Phase Locked Loop) circuit.

FIG. 9 shows one example of configuration of a reproducing device having an analog type PLL circuit.

A reading device 101 is operated such that a laser beam is radiated against an optical disk 201 such as a compact disk or the like, the laser beam (returning beam) reflected by the optical disk 201 is received and an electrical signal (a reproducing signal) corresponding to an amount of received light of the returning beam is outputted to a wave form shaping circuit 122.

The wave form shaping circuit 102 makes a reproduced signal supplied from the reading device 101 into a binary code and outputs the binary coded value to a latch circuit 103 and an analogue PLL circuit 104 as the reproduced signal.

The analogue PLL circuit 104 extracts a clock signal from the reproduced signal supplied by the wave form shaping circuit 102 and outputs the signal to the latch circuit 103. In this reproducing signal, its value (0 or 1) is changed in correspondence with an interval (corresponding to data recorded on the optical disk 201) of times of integer of a predetermined bit interval T, i.e. the channel clock with a period T. Accordingly, the analogue PLL circuit 104 extracts the bit interval T from this interval and generates a clock signal with a period corresponding to this bit interval T.

In this analogue PLL circuit 104, a phase comparator 121 calculates a phase error between a reproduced signal supplied by the wave form shaping circuit 102 and a clock signal (a PLL clock signal) oscillated by a voltage controlled oscillator (VCO) 123, outputs the phase error to a loop filter 122, the loop filter 122 removes a component (a high frequency component) in a frequency band not requiring any phase error supplied by the phase comparator 121, thereafter outputs the processed phase error to VCO 123.

The VCO 123 oscillates a clock signal while an oscillating frequency is being adjusted in such a way that the phase error for the reproducing signal supplied by the wave form shaping circuit 102 may be eliminated and then outputs its clock signal to the phase comparator 121 and the latch circuit 103.

In this way, the analogue PLL circuit 104 may generate a clock signal which is synchronous with the reproduced signal.

The latch circuit 103 is constructed to output the reproduced signal supplied from the wave form shaping circuit 102 in synchronism with the clock signal supplied from the analogue PLL circuit 104 to a later-stage reproducing circuit (not shown).

The aforesaid PLL circuit acting as an analogue circuit has a problem that it is easily influenced by an environmental variation, an aging variation and a dispersion of component parts or the like. In addition, since this is an analogue circuit, it has a problem that its integration is difficult to perform.

In view of the foregoing, it has been developed to provide a PLL circuit which is changed into a digital form.

FIG. 10 shows one example of a configuration of the digital PLL circuit.

In the digital PLL circuit, the digital-changed phase comparator 141 and the digital-changed loop filter 142 are utilized and at the same time a variable frequency oscillator (VFO) 143 is utilized in place of VCO. This VFO 143 adjusts a frequency by adding or removing a pulse against an oscillating signal having a predetermined frequency in response to a phase error (a digital value) supplied through the loop filter 142. Or, VFO 143 changes over two stored oscillators with different oscillating frequencies and adjusts the oscillating frequency in response to a phase error supplied through the loop filter 142.

In the case that an oscillating frequency is smoothly adjusted in response to a phase error, VFO 143 outputs a signal having several times of frequency of outputted signal while the oscillating frequency is being adjusted in response to the phase error, supplies the output signal (clock signal) to the phase comparator 141 after the frequency divider 144 divides a frequency of the signal and at the same time outputs the signal to the later stage circuit (not shown).

However, in the case of a devices having a fast data processing speed or a device having a fast transfer speed, a high frequency of clock signal is attained and it is hard to realize VFO oscillating a signal with several times of frequency of the clock signal and so even if this is realized, it has still a problem that its cost is high.

SUMMARY OF THE INVENTION

In view of the foregoing, the present applicant disclosed a device in the past, as shown in FIG. 11, in Japanese Patent Application No. Hei 3-184428 in which a second clock signal is produced while a clock frequency is being adjusted in response to a phase error of the reproduced signal in synchronism with the first clock signal, an interpolated value of the second clock signal at a predetermined phase is calculated from a sampled value (a first digital value) produced while the reproduced signal being sampled in synchronism with the first clock signal so as to cause the device to be operated at a relative low clock frequency.

In turn, a method for utilizing a frequency error in order to expand a frequency range which can be led in (a capture range) and to shorten a time until the leading-in is completed (a leading-in time) in PLL is already described in "New Type High Speed Leading-In PLL Using Frequency Sensor" (edited by Hiroyuki Shirahama, Kenji Taniguchi and Kenichi Nakashi, Bulletin Paper of the Association of Electronic Information Communication, C-II, Vol. J76-C-11, No. 10 pp. 679–687), for example.

In this method, an output of VCO in PLL and a frequency error of an input signal are detected, the frequency error and the phase error detected by the base comparator are inputted to VCO when the leading-in is carried out, the capture range is widened and at the same time, the leading-in time is shortened.

However, the aforesaid method utilizing the frequency error is applied to an analogue PLL circuit and this has a problem that it is hard to apply it to a digital PLL circuit handling the aforesaid digital signal.

In view of the foregoing circumstances, the present invention has been completed in order to realize a digital PLL circuit in which an input signal is sampled in synchronism with a clock signal, a phase error between the sampled digital signal and the clock signal is calculated, a frequency error between the digital signal and the clock signal is calculated, a clock signal is generated in correspondence with a sum of the phase error and the frequency error, a capture range utilizing the frequency error is wide and a leading-in time is short.

The converter device described in claim 1 is characterized in that the device is comprised of a sampling means for sampling an analogue signal in synchronism with a clock signal and outputting a digital signal corresponding to the analogue signal; a first calculating means for calculating a phase error between a digital signal and a clock signal outputted by the sampling means; a second calculating means for a frequency error between the digital signal and the clock signal in reference to the phase error; a generating means for generating a clock signal in correspondence with a sum of the phase error and the frequency error; and a processing means for processing a digital signal to generate a digital data.

The converting method described in claim 5 is characterized in that this method is comprised of the steps of sampling an analogue signal in synchronism with a clock signal and outputting a digital signal corresponding to the analogue signal; calculating a phase error between the digital signal and the clock signal; calculating a frequency error between the digital signal and the clock signal in reference to a phase error; generating a clock signal in correspondence with a sum of the phase error and the frequency error; and processing the digital signal to generate the digital data. The PLL calculating device described in claim 6 is characterized in that the same is comprised of a sampling means for sampling an analogue signal in synchronism with a clock signal and outputting a digital signal corresponding to an analogue signal; a first calculating means for calculating a phase error between the digital clock outputted by the sampling means and the clock signal; a second calculating means for calculating a frequency error between the digital signal and the clock signal in reference to a phase error; and a generating means for generating the clock signal.

The PLL calculating method described in claim 9 is characterized in that the same is comprised of the steps of sampling an analogue signal in synchronism with a clock signal and outputting a digital signal corresponding to the analogue signal; calculating a phase error between a digital signal and a clock signal; calculating a frequency error between a digital signal and a clock signal in reference to a phase error; and generating a clock signal in correspondence with a sum of the phase error and the frequency error.

In the converter device described in claim 1, the sampling means samples an analogue in synchronism with a clock signal and outputs a digital signal corresponding to an analogue signal, the first calculating means calculates a phase error between a digital signal outputted by the sampling means and the clock signal, the second calculating means calculates a frequency error between the digital signal and the clock signal in reference to the phase error, the generating means generates a clock signal in correspondence with a sum of the phase error and the frequency error, and the processing means processes a digital signal and generates a digital data.

In the converting method described in claim 5, an analogue signal is sampled in synchronism with a clock signal, a digital signal corresponding to the analogue signal is outputted, a phase error between the digital signal and the clock signal is calculated, a frequency error between the digital signal and the clock signal is calculated in reference to a phase error, a clock signal is generated in correspondence with a sum of the phase error and the frequency error and the digital signal is processed to generate a digital data.

In the PLL calculating device described in claim 6, the sampling means samples an analogue signal in synchronous with a clock signal and outputs a digital signal and outputs a digital signal corresponding to the analogue signal, the first calculating means calculates a phase error between the digital signal outputted by the sampling means and the clock signal, the second calculating means calculates a frequency error between the digital signal and the clock signal in reference to the phase error, and the generating means generates a clock signal in correspondence with a sum of the phase error and the frequency error.

In the PLL calculating method described in claim 9, an analogue signal is sampled in synchronism with a clock signal, a digital signal corresponding to the analogue signal, a phase error between the digital signal and the clock signal is calculated, a frequency error between the digital signal and the clock signal is calculated and then a clock signal is generated in correspondence with a sum of the phase error and the frequency error.

BRIEF DESCRIPTION OF THE DRAWINGS

FIG. 5 is a view for showing one example of a phase error between a reproduced signal and a PLL clock signal.

DESCRIPTION OF THE PREFERRED EMBODIMENTS

Figure 1:
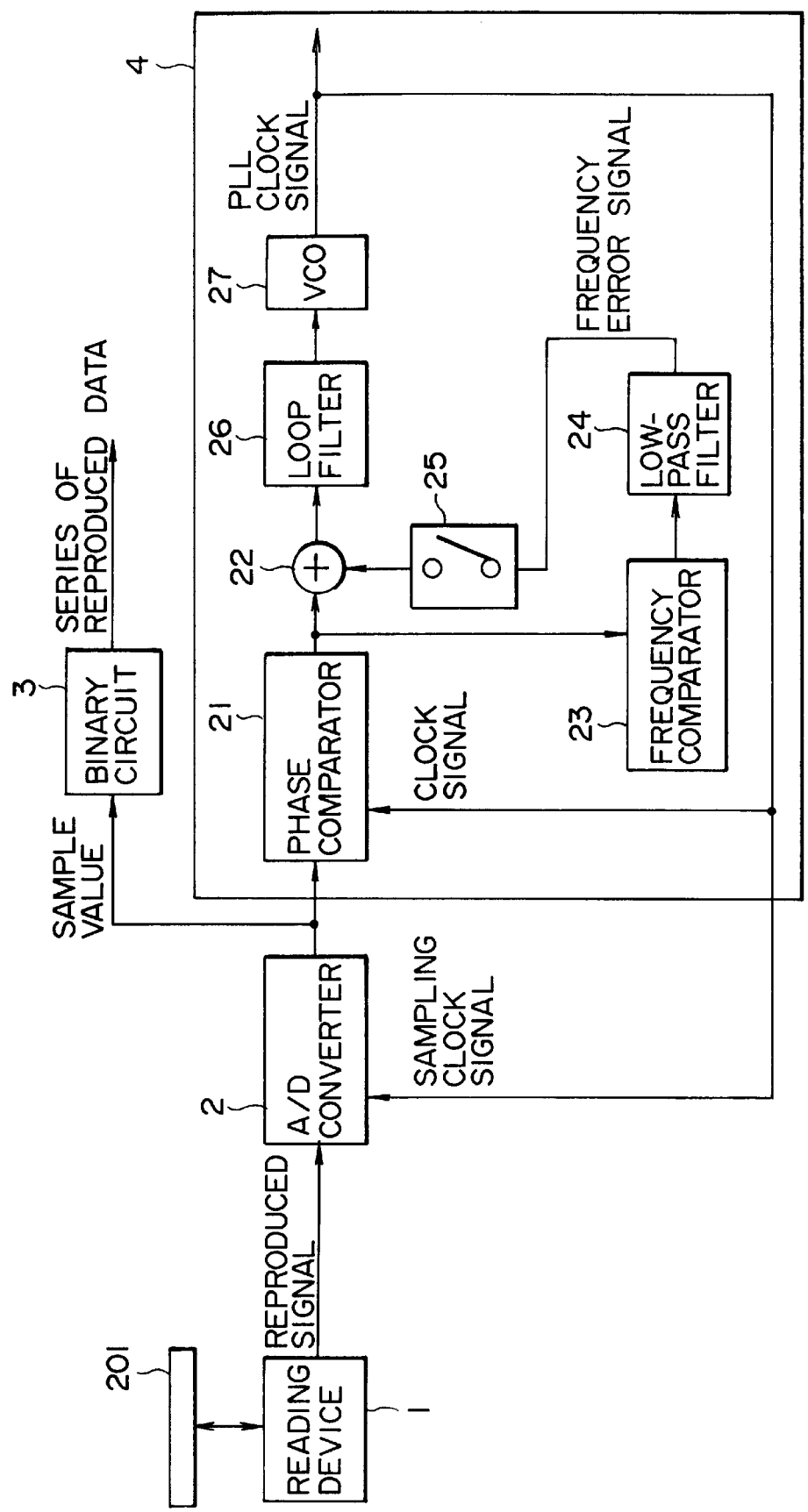
FIG. 1 is a block diagram for showing one example of configuration of a reproducing device to which the converter device of the present invention is applied.

FIG. 1 shows one example of a configuration of a reproducing device to which the converting device of the present invention is applied.

A reading device 1 is constructed such that a laser beam is radiated against an optical disk 201 such as a compact disk, a laser beam (a returning light) reflected at the optical disk 201 is received and then an electrical signal (a reproducing signal) corresponding to an amount of light of the received returning light is outputted to an A/D converter 2 (a sampling means). The A/D converter 2 samples a reproduced signal supplied by the reading device 1 in synchronism with a sampling clock signal (a PLL clock signal) supplied by the PLL circuit 4 and outputs the value (sample value) (a digital value with a predetermined number of bits) to a binary circuit 3 (a processing means) and a phase comparator 21 (a first calculating means) in the PLL circuit 4.

The binary circuit 3 is operated in synchronism with the PLL clock signal, changes the sample value supplied from the A/D converter 2 into a binary code and outputs it to a later stage circuit (not shown).

The phase comparator 21 in the PLL circuit 4 is operated with a PLL clock signal, detects a change of the sample value supplied from the A/D converter 2 from its positive value to negative value or from its negative value to positive value (a zero cross), outputs a phase error detected signal corresponding to the zero cross to a frequency comparator 23 (a second calculating means), calculates the phase error signal in correspondence with a timing of the zero cross and outputs the phase error signal to an adder 22 and the frequency comparator 23, respectively.

The frequency comparator 23 detects a frequency error in reference to a variation of value of the phase error signal supplied from the phase comparator 21 and outputs a signal corresponding to the frequency error to the low pass filter 24.

The low pass filter 24 restricts a high frequency component of a signal supplied from the frequency comparator 23, thereafter outputs it to a switch 25.

In the case that an absolute value of output of the phase comparator 21, for example, is higher than a predetermined value only for a predetermined period of time, the switch 25 discriminates that PLL is kept in a synchronous led-in state to output a signal supplied from the low pass filter 24 and in turn in the case that the absolute value is not higher than the predetermined value, the switch 25 discriminates that PLL is kept at a synchronous lock state, it becomes OFF state and a signal supplied by the low pass filter 24 is prevented from being outputted to the adder 22.

The loop filter 26 restricts a high frequency component of a signal supplied from the adder 22, thereafter outputs it to VCO 27 (a generating means).

VCO 27 oscillates a PLL clock signal with a frequency corresponding to a voltage of a signal supplied from the loop filter 26 and supplies the PLL clock signal to the A/D converter 2 and the phase comparator 21 or the like.

Figure 2:
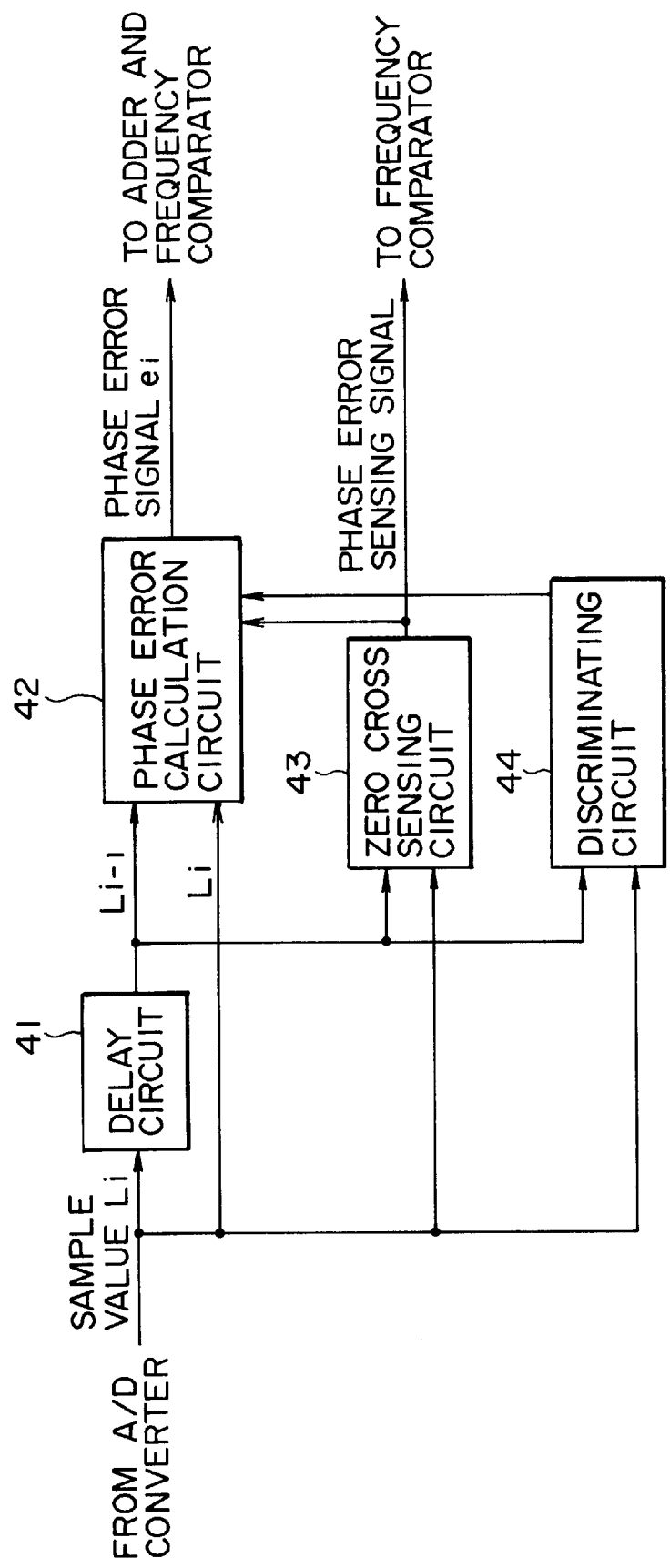
FIG. 2 is a block diagram for showing an example of configuration of a phase comparator shown in FIG. 1.

FIG. 2 shows an example of a configuration of the phase comparator 21. A delay element 41 holds a sample value $L_i$ supplied from the A/D converter 2 only for a period of 1 clock of the PLL clock signal and outputs it in a next clock to a phase error calculating circuit 42, a zero cross sensing circuit 43 and a discriminating circuit 44. Namely, at a clock to which the sample value $L_i$ is supplied, the delay element 41 outputs a sample value $L_{i-1}$ supplied before 1 clock to a phase error calculating circuit 42, the zero-cross sensing circuit 43 and the discriminating circuit 44.

In the case that a code of the sample value $L_{i-1}$ supplied from the delay element 41 before 1 clock is different from that of a sample value $L_i$ supplied from the A/D converter 2, the zero-cross sensing circuit 43 discriminates if a zero-cross is generated at the reproduced signal and then outputs a phase error sensing signal corresponding to the occurrence of zero-cross to the phase error sensing circuit 42 and the frequency comparator 23.

The discriminating circuit 44 compares the sample value $L_{i-1}$ before 1 clock supplied from the delay element 41 with a sample value $L_i$ supplied from the A/D converter 2, discriminates if the zero-cross generated in the reproduced signal is a descending zero-cross or a rising zero-cross and outputs a signal corresponding to a direction of the zero-cross to the phase error calculating circuit 42.

Namely, the discriminating circuit 44 discriminates if $L_{i-1}$ is positive or $L_i$ is negative and in the case that the discriminating circuit 44 discriminates that $L_{i-1}$ is positive or $L_i$ is negative, the discriminating circuit 44 discriminates that a descending zero-cross is generated at the reproduced signal, supplies a signal corresponding to this state to the phase error calculating circuit 42, and further discriminates if $L_{i-1}$ is negative and $L_i$ is positive and in tie case that the discriminating circuit 44 discriminates that $L_{i-1}$ is negative and $L_i$ is positive, the discriminating circuit 44 discriminates that a rising zero-cross is generated at the reproduced signal, supplies a signal corresponding to this state to the phase error calculating circuit 42.

The phase error calculating circuit 42 calculates a phase error signal from the sample value $L_{i-1}$ before 1 clock supplied from the delay element 41 and the sample value $L_i$ supplied from the A/D converter 2 in response to a signal supplied from the zero-cross sensing circuit 43 and a signal supplied from the discriminating circuit 44, and outputs the phase error signal to the adder 22 and the frequency comparator 23.

Namely, the phase error calculating (circuit 42 calculates a sum $(L_{i-1}+L_i)$ of an interpolated value $L_{i-1}$ and an interpolated value $L_i$ in the case that a signal corresponding to the rising zero-cross is supplied, outputs the sum as a phase error signal to the adder 22 and the frequency comparator 23 and in turn in the case that a signal corresponding to the descending zero-cross is supplied, the phase error calculating circuit 42 calculates a value $(-(L_{i-1}+L_i))$ in which a sum of the interpolated value $L_{i-1}$ and the interpolated value $L_i$ is multiplied by −1, and outputs the value as a phase error signal to the adder 22 and the frequency comparator 23.

Figure 3:
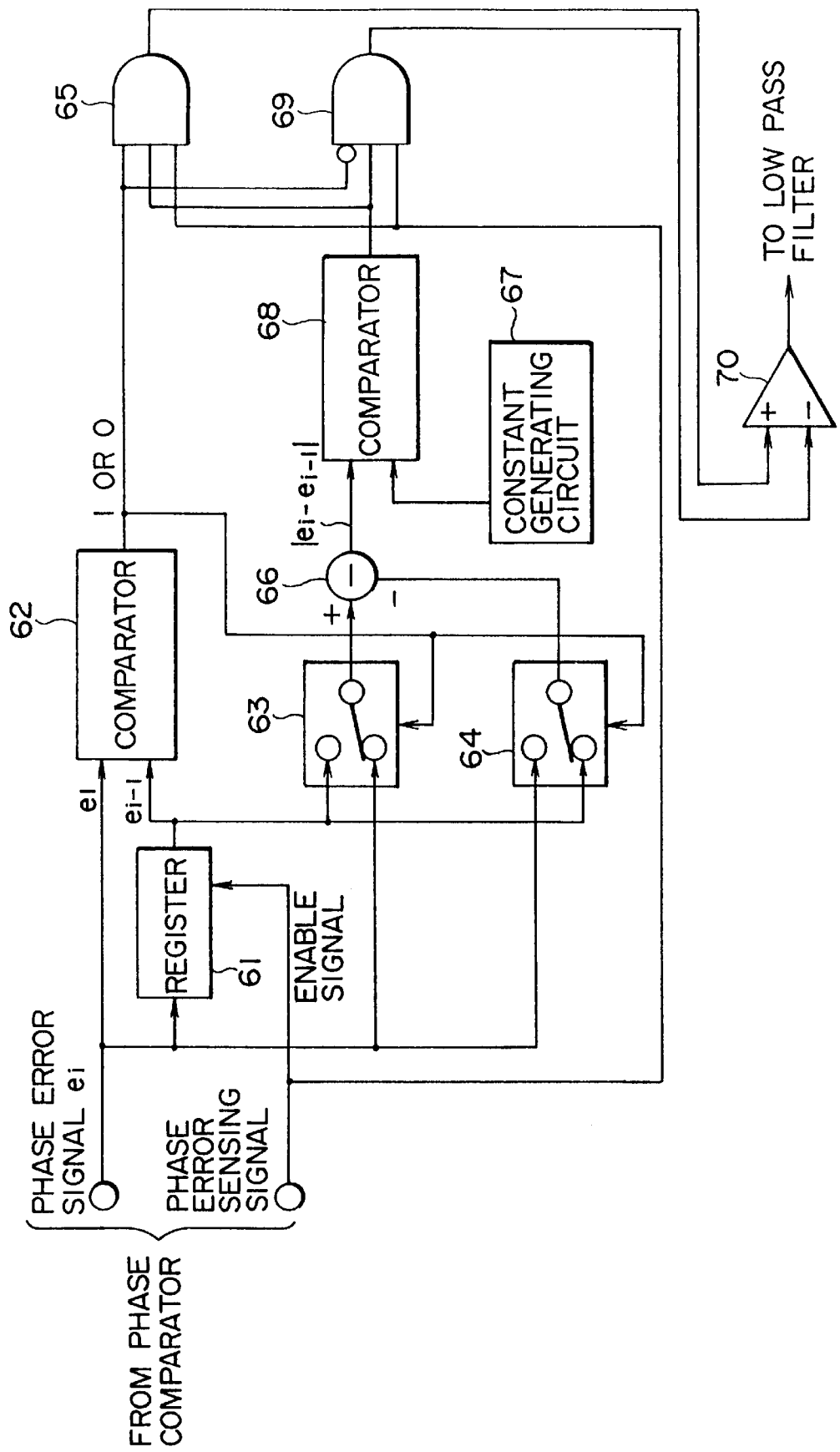
FIG. 3 is a block diagram for showing an example of configuration of a frequency comparator shown in FIG. 1.

FIG. 3 shows an example of configuration of the frequency comparator 23.

A register 61 is constructed such that it has a phase error sensing signal supplied from the phase comparator 21 as an enable signal, holds a value $e_{i-1}$ of the phase error signal supplied from the phase comparator 21 when the enable signal is supplied, and outputs the value $e_{i-1}$ to the comparator 62 when the signal is supplied.

A comparator 62 compares a value $e_{i-1}$ prior to one in a phase error signal supplied from the register 61 with a value $e_i$ of the phase error signal supplied from the phase comparator 21 and outputs a value 1 to switches 63, 64 and AND circuits 65, 69 when the value $e_i$ is higher than $e_{i-1}$ and further outputs a value 0 when the value $e_i$ is less than $e_{i-1}$.

In the case that the value supplied from the comparator 62 is 1, the switch 63 outputs the value $e_i$ of the phase error signal to a subtractor 66 and in the case that a value supplied from the comparator 62 is 0, the switch 63 outputs to the subtractor 66 the value $e_{i-1}$ prior to one in the phase error signal supplied from the register 61.

The switch 64 outputs the value $e_i$ of the phase error signal to the subtractor 66 when the value supplied from the comparator 62 is 1, and outputs the value $e_{i-1}$ prior to one in the phase error signal supplied from the register 61 when the value supplied from the comparator 62 is 0.

The subtractor 66 outputs to the comparator 68 a value in which the value supplied from the switch 64 is subtracted from the value supplied from the switch 63 (i.e. $|e_i - e_{i-1}|$).

A constant generating circuit 67 generates a predetermined threshold value for use in comparing with $|e_i - e_{i-1}|$ and outputs the value to the comparator 68.

The comparator 68 compares the value $|e_i - e_{i-1}|$ supplied from the subtractor 66 with the threshold value supplied from the constant generating circuit 67, outputs the value 1 to AND circuits 65, 69 when the value $|e_i - e_{i-1}|$ is higher than the threshold value and outputs the value 0 when the value $|e_i - e_{i-1}|$ is less than the threshold value.

AND circuit 65 calculates a logical multiplication of a value supplied from a comparator 62, a value supplied from the comparator 68 and a phase error sensing signal supplied from the phase comparator 21 and then outputs a result of the calculation to a differential amplifier 70.

The differential amplifier 70 amplifies a difference between a value supplied from the AND circuit 65 and a value supplied from the AND circuit 69 and outputs the amplified signal to the low pass filter 24.

Then, an operation of the reproducing device shown in FIG. 1 will be described.

At first, the A/D converter 2 performs a sampling of the reproduced signal supplied from the reading device 1 in accordance with the PLL signal oscillated by VCO 27 in the PLL circuit 4 and outputs the sample value to the binary circuit 3 and the phase comparator 21 in the PLL circuit 4.

In the phase comparator 21, the zero-cross sensing circuit 43 receives an interpolated value $L_{i-1}$ and an interpolated value $L_i$ of the reproduced signal prior to one system clock, discriminates if $L_{i-1}$ negative, $L_i$ is positive or $L_{i-1}$ is positive, $L_i$ is negative and when $L_{i-1}$ is negative, $L_i$ is positive or $L_{i-1}$ is positive, $L_i$ is negative, the zero-cross sensing circuit 43 discriminates that the zero-cross is generated and then the circuit outputs its corresponding signal to the phase error calculating circuit 42.

At this time, the discriminating circuit 44 discriminates if the interpolated value $L_{i-1}$ of the reproduced signal prior to 1 system clock is negative and the interpolated value $L_i$ is positive, and when $L_{i-1}$ is negative and $L_i$ is positive, the circuit 44 discriminates that a rising zero-cross is generated at the interpolated value and supplies its corresponding signal to the phase error calculating circuit 42.

As the signal corresponding to the rising zero-cross is supplied, the phase error calculating circuit 42 calculates a sum $(L_{i-1} + L_i)$ of the interpolated value $L_{i-1}$ and the interpolated value $L_i$ prior to 1 system clock and then outputs the sum as the phase error signal to the adder 22 and the frequency comparator 23.

Figure 4A:
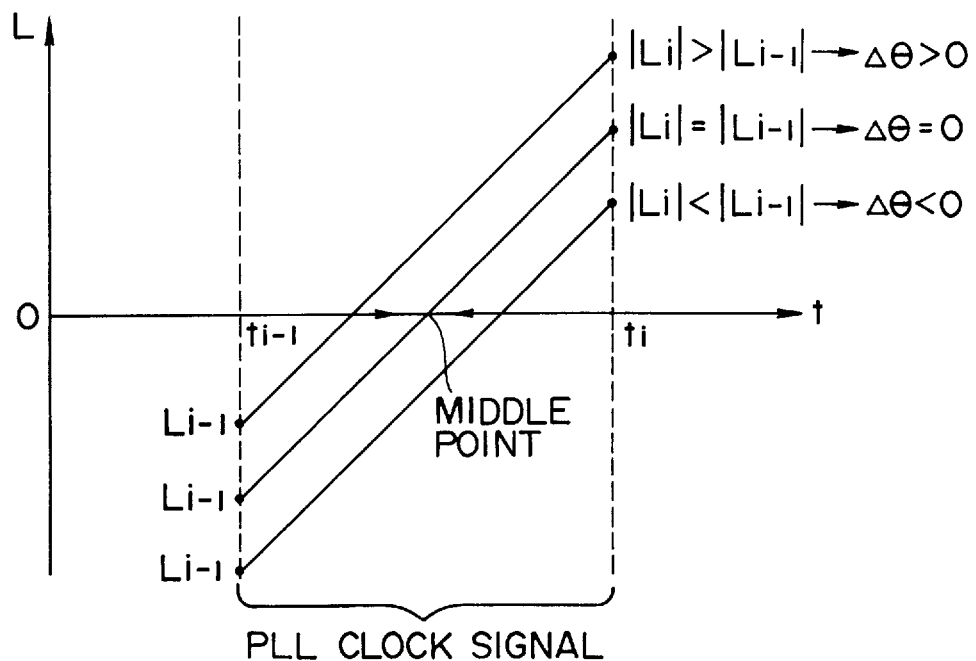
FIGS. 4A and 4B are views for showing an example of a relation between a sample value $L_{i-1}$ $L_i$ and a phase error $\Delta\Theta$ of a reproduced signal.

FIG. 4A shows a relation of values of the interpolated values $L_{i-1}$, $L_i$ and a value of the phase error signal $\Delta\theta$ when the rising zero-cross is detected. In the case that an absolute value of the interpolated value $L_i$ is larger than an absolute value of the interpolated value $L_{i-1}$, a value of $\Delta\theta$ becomes positive. To the contrary, in the case that an absolute value of the interpolated value $L_i$ is smaller than an absolute value of the interpolated value $L_{i-1}$, a value of $\Delta\theta$ becomes negative.

In turn, the discriminating circuit 44 discriminates if $L_{i-1}$ is positive and $L_i$ is negative and when it is discriminated that $L_{i-1}$ is positive and $L_i$ is negative, the circuit discriminates that the rising zero-cross is generated at the interpolated value and then its corresponding signal is supplied to the phase error calculating circuit 42.

As the signal corresponding to the descending zero-cross is supplied, the phase error calculating circuit 42 calculates a value $(-(L_{i-1} + L_i))$ in which a sum of the interpolated value $L_{i-1}$ and the interpolated value $L_i$ prior to 1 system clock is multiplied by −1 and outputs the calculated value as the phase error signal to the adder 22 and the frequency comparator 23.

Figure 4B:
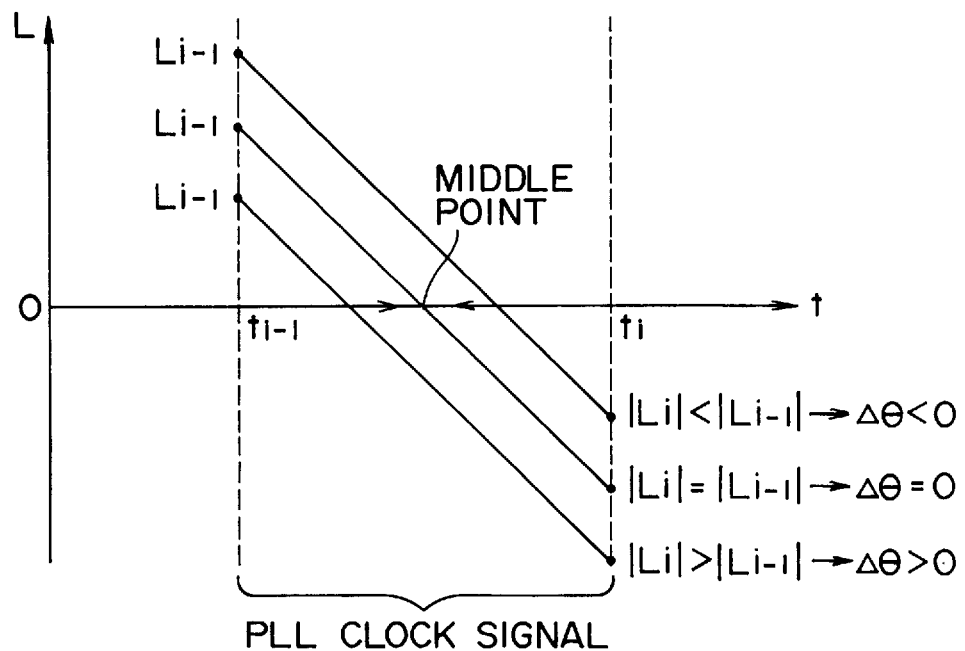

FIG. 4B shows a relation of values of the interpolated values $L_{i-1}$, $L_i$ and a value of the phase error signal $\Delta\theta$ when the descending zero-cross is detected. In the case that an absolute value of the interpolated value $L_i$ is larger than an absolute value of the interpolated value $L_{i-1}$ a value of $\Delta\theta$ becomes positive. To the contrary, in the case that an absolute value of the interpolated value $L_i$ is smaller than an absolute value of the interpolated value $L_{i-1}$, a value of $\Delta\theta$ becomes negative.

Additionally, in the case that the interpolated value $L_{i-1}$ and the interpolated value $L_i$ have the same codes to each other, no zero-cross is generated, resulting in that the zero-cross sensing circuit 43 does not output any signal in particular to the phase error calculating circuit 42. Then, the phase error calculating circuit 42 may output a zero as a phase error signal in the case that a signal corresponding to the zero-cross is not supplied by the zero-cross sensing circuit 43.

As shown in FIG. 4, in the case that a time in which a value L linearly interpolated with an interpolated value $L_{i-1}$ at a time of $t_{i-1}$ and an interpolated value $L_i$ at a time of $t_i$ becomes 0 is smaller than a middle point between the time $t_{i-1}$ and the time $t_i$ in both cases of a rising zero-cross and a descending zero-cross, the phase comparator 21 outputs a positive phase error signal to the adder 22 and the frequency comparator 23 and in turn in the case that the time in which the value L becomes 0 is larger than a middle point between the time $t_{i-1}$ and the time $t_i$, the phase comparator 21 outputs a negative phase error signal.

Then, at the frequency comparator 23, the comparator 62 compares a value $e_{i-1}$ prior to one phase error signal supplied from the register 61 with a value $e_i$ of the phase error signal supplied from the phase comparator 21 and in the case that $e_i$ is Larger than $e_{i-1}$, it outputs a value 1 to the switches 63, 64 and the AND circuits 65, 69 and in turn in the case that $e_i$ is less than $e_{i-1}$, it outputs a value 0.

The switch 63 outputs a value $e_i$ of the phase error signal to the subtractor 66 when the value supplied from the comparator 62 is 1 and it outputs a value $e_{i-1}$ prior to one phase error signal supplied from the register 61 in the case that the value supplied from the comparator 62 is 0, and the switch 64 outputs a value $e_i$ prior to one phase error signal supplied from the register 61 in the case that the value supplied from the comparator 62 is 1 and further outputs the value $e_i$ of the phase error signal to the subtractor 66 in the case that the value supplied from the comparator 62 is 0.

The subtractor 66 outputs to the comparator 68 the value in which the value supplied from the switch 64 is subtracted from the value supplied from the switch 63 (i.e. $|e_i-e_{i-1}|$).

The comparator 68 compares the value $|e_i-e_{i-1}|$ supplied from the subtractor 66 with a threshold value supplied from the constant generating circuit 67, outputs the value 1 to the AND circuits 65, 69 in the case that $|e_i-e_{i-1}|$ is larger than the threshold value and outputs the value 0 to them in the case that $|e_i-e_{i-1}|$ is less than the threshold value.

The AND circuit 65 calculates a logical multiplication of the value supplied from the comparator 62, the value supplied from the comparator 68 and the phase error sensing signal supplied from the phase comparator 21 and outputs the result of calculation to the differential amplifier 70.

Namely, the AND circuit 65 outputs the value 1 in synchronous with the phase error sensing signal in the case that a relation of $e_i>e_{i-1}$ occurs and a varying amount of the phase errorl $|e_i-e_{i-1}|$ is larger than the threshold value and otherwise the circuit outputs the value 0.

Figure 6:
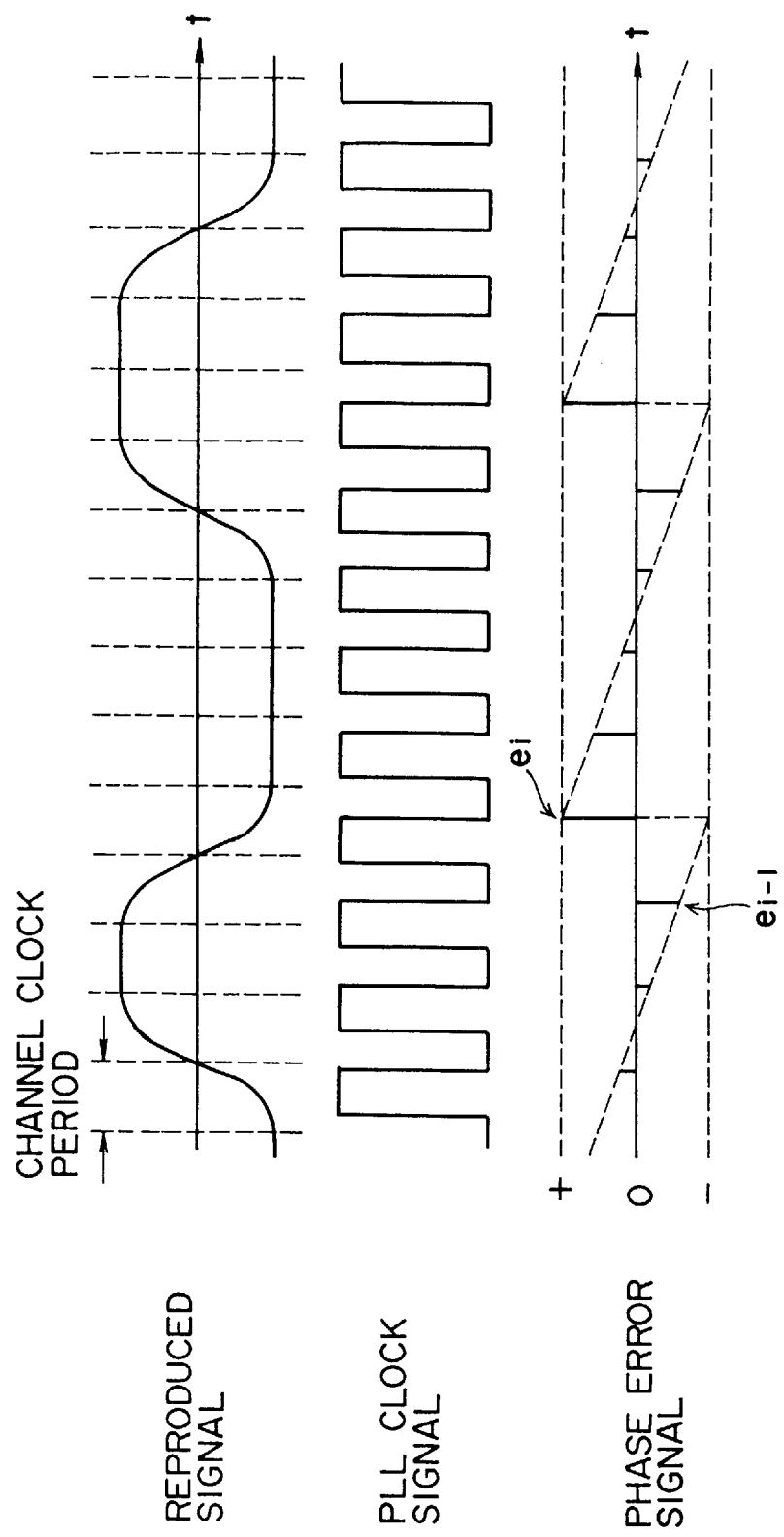
FIG. 6 is a view for showing one example of sensing of a frequency error between a reproduced signal and a PLL clock signal.

As shown in FIG. 5, in the case that the frequency of the PLL clock signal is lower than the frequency of the channel clock of the reproduced signal (a clock which is synchronous with a zero-cross of the reproduced signal), the phase of the PLL clock signal is delayed in respect to the phase of the channel clock, resulting in that the phase error has a negative gradient. In this case, the phase error signal outputted from the phase comparator 21 corresponds to a size of the phase error shown in FIG. 5 and as shown in FIG. 6, it is outputted in a dispersed manner in synchronism with the PLL clock signal.

Accordingly, in the case that the phase error with a negative gradient passes by 180°, it shows a relation of $e_i>e_{i-1}$ and a varying value of $|e_i-e_{i-1}|$ is larger than the threshold value, so that it becomes apparent that the frequency of the PLL clock signal is lower than the frequency of the channel clock and so a signal (value 1) corresponding to it is outputted from the AND circuit 65. In addition, in the case that a difference in frequency between the PLL clock signal and the channel clock is higher, the timed in which the phase error passes by 180° is increased, so that the AND circuit 65 outputs more signals with a value 1.

As found in the preferred embodiments of the present invention, in the case that the clock signal corresponding to the channel clock is generated in self-synchronization form, a maximum inverting time for the reproduced signal is set in advance to a value not large enough as to prevent a clock skew from being generated in PLL, resulting in that the value $e_i$ of the phase error signal is frequently calculated during 1 period of the phase error. Accordingly, since a varying value of output of the phase comparator 21 $|e_i-e_{i-1}|$ when the phase error passes by 180° is larger than the value when the phase error does not pass by 180°, resulting in that the aforesaid threshold value is set such that both of them can be discriminated.

The AND circuit 69 calculates a logical multiplication of the value with inverted value supplied by the comparator 62, the value supplied by the comparator 68 and the phase error sensing signal supplied by the phase comparator 21, and outputs the result of calculation to the differential amplifier 70.

Namely, the AND circuit 69 outputs the value 1 in synchronous with the phase error sensing signal in the case that a relation of $e_i \leq e_{i-1}$ and $|e_i-e_{i-1}|$ is larger than the threshold value and otherwise, it may output the value 0.

Figure 7:
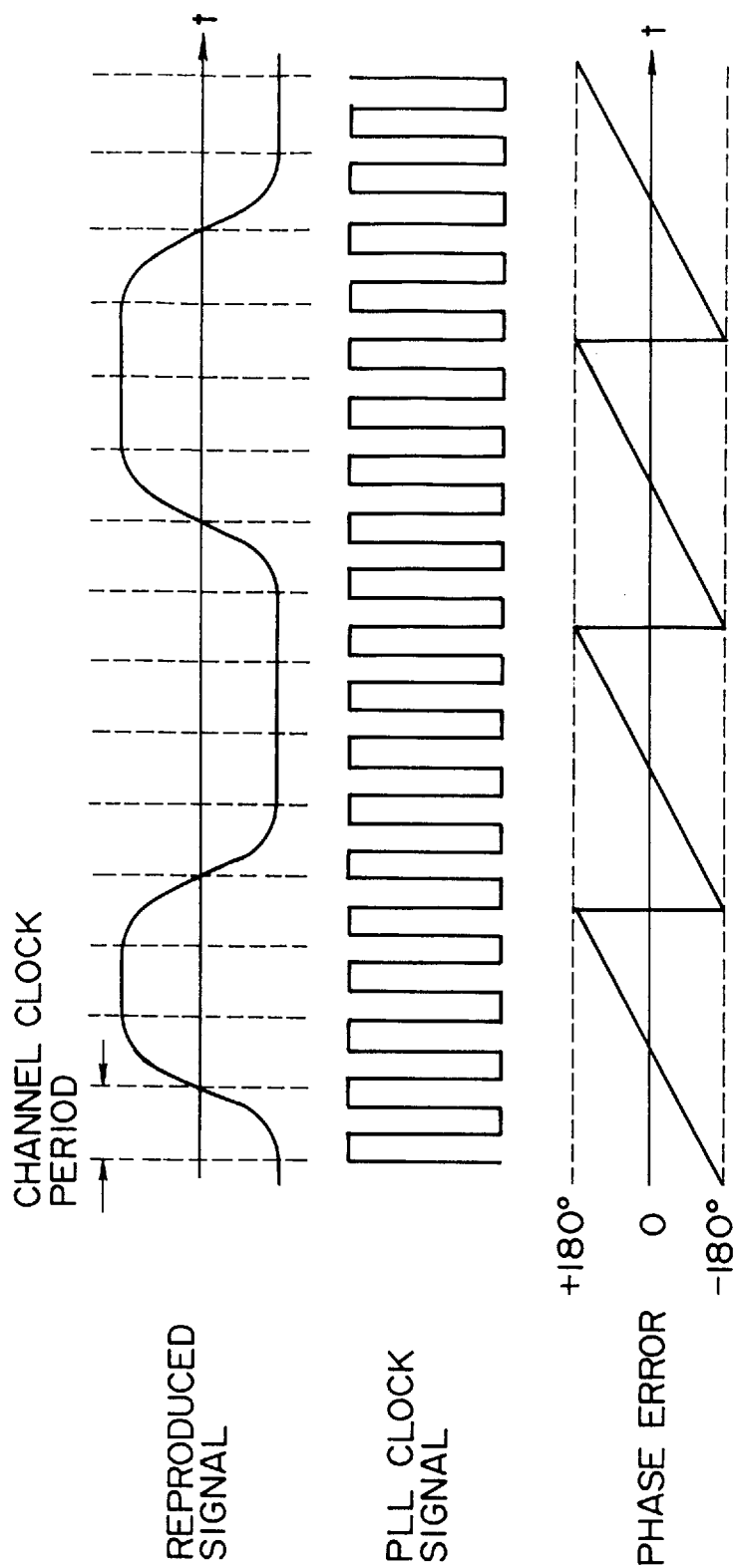
FIG. 7 is a view for showing another example of a phase error between a reproduced signal and a PLL clock signal.

As shown in FIG. 7, in the case that a frequency of the PLL clock signal is higher than a frequency of a channel clock (a clock which is synchronous with a zero-cross of the reproduced signal) a phase of the PLL clock signal advances against a phase of the channel clock, so that the phase error has a positive gradient.

Figure 8:
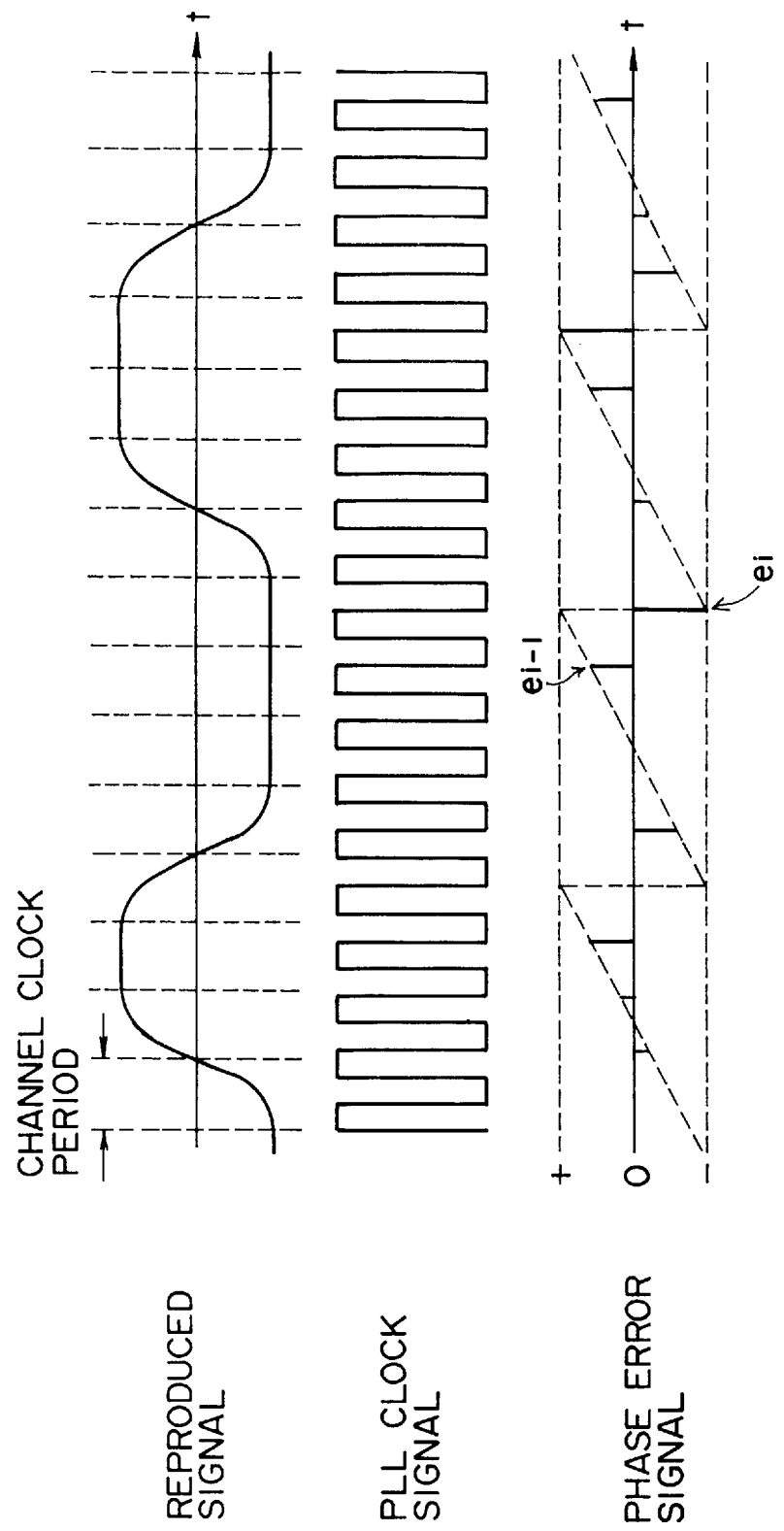
FIG. 8 is a view for showing another example of sensing of a frequency error between a reproduced signal and a PLL clock signal.
Figure 9:
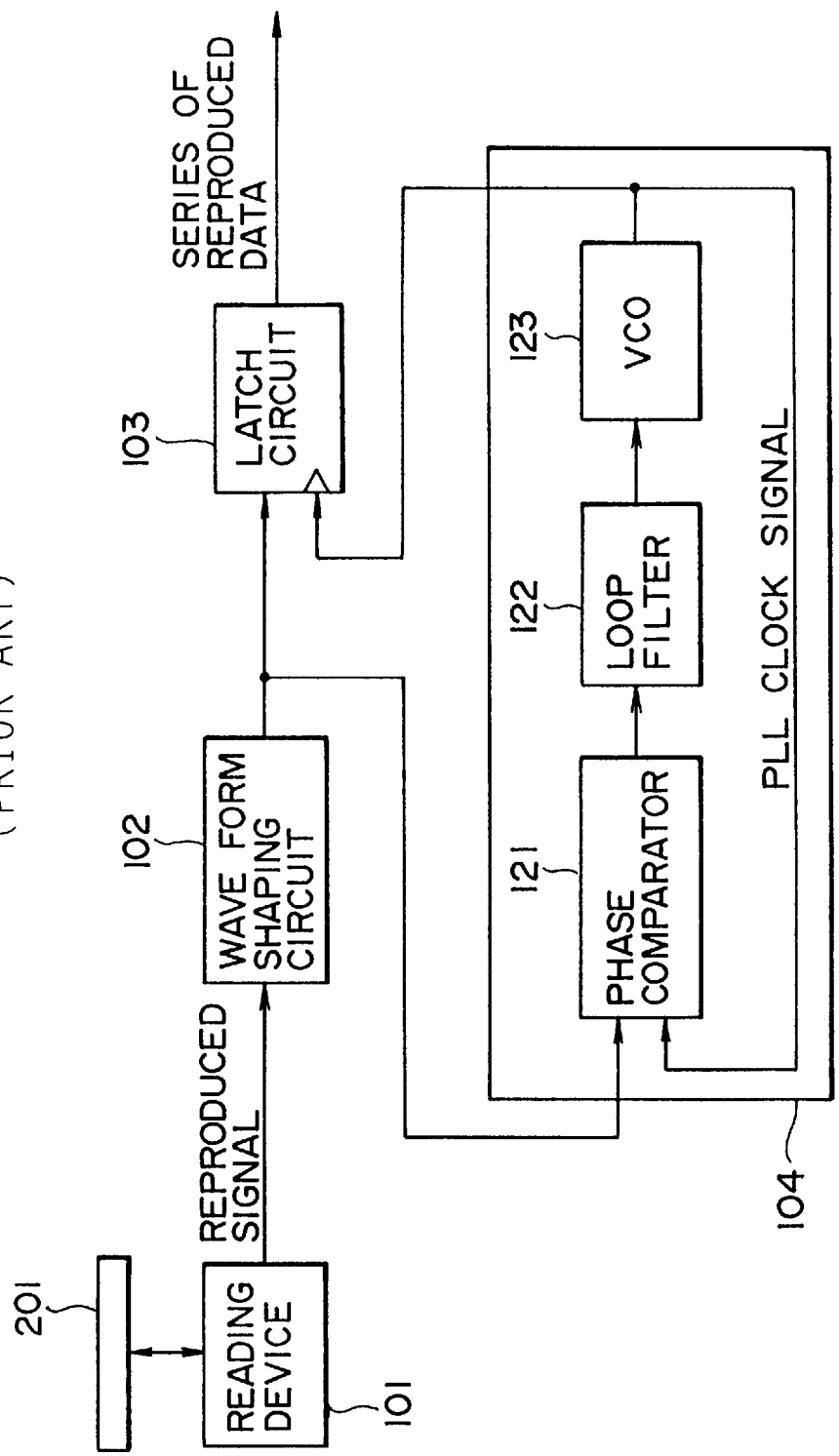
FIG. 9 is a block diagram for showing one example of configuration of a reproducing device having an analogue type PLL circuit.
Figure 10:
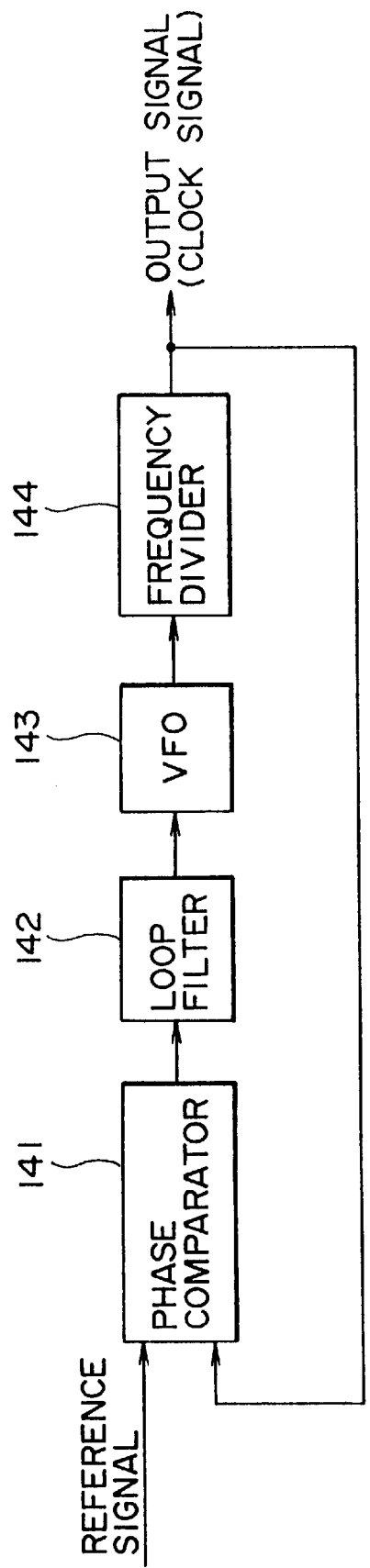
FIG. 10 is a block diagram for showing one example of configuration of the prior art digital PLL circuit.
Figure 11:
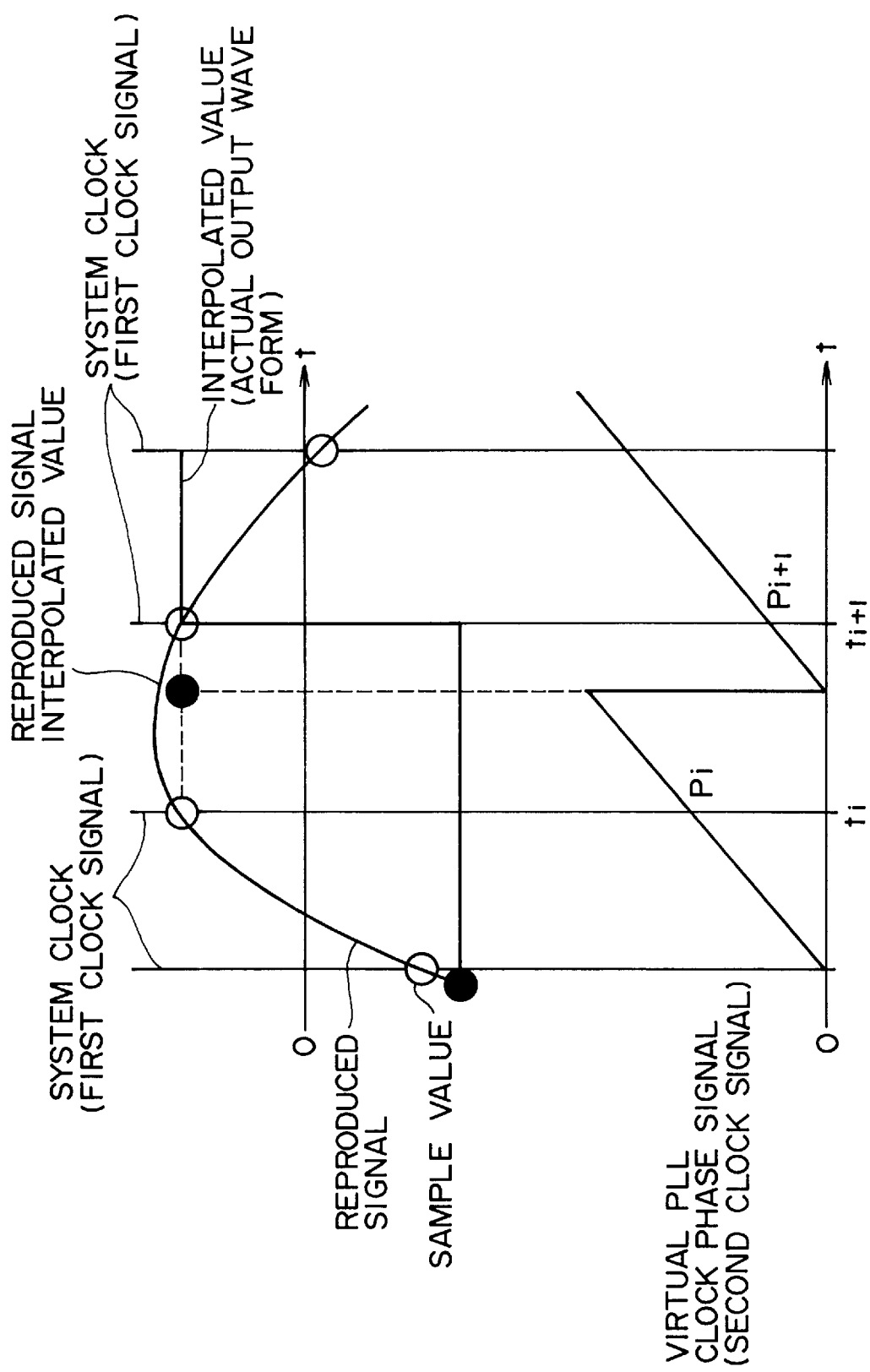
FIG. 11 is a view for showing one example of an interpolated value calculated by the prior art method.

In this case, the phase error signal outputted from the phase comparator 21 corresponds to a size of the phase error shown in FIG. 7 and further as shown in FIG. 8, it is outputted in a dispersed manner in synchronous with the PLL clock signal.

Accordingly, in the case that the phase error with a positive gradient passes by 180°, a relation of $e_i {}_{<ei-1}$ is found and a varying amount of the phase error of $|e_i-e_{i-1}|$ is larger than the threshold value, so that it becomes apparent that a frequency of the PLL clock signal is higher than a frequency of the channel clock and the signal (the value 1) corresponding to it is outputted from the AND circuit 69. In addition, in the case that a difference in frequency between the PLL clock signal and the channel clock is higher, the number of times where the phase error passes by 180° is increased, so that the AND circuit 69 may output more amount of signals of value 1.

The differential amplifier 70 amplifies a value in which a value supplied from the AND circuit 69 is subtracted from the value supplied from the AND circuit 65 and outputs the amplified signal to the low pass filter 24.

Namely, the differential amplifier 70 outputs a positive signal having a value corresponding to a value of the frequency error to the low pass filter 24 as the frequency error signal in the case that the frequency of the PLL clock signal is lower than a frequency of the channel clock and in turn in the case that the frequency of the PLL clock signal is higher than a frequency of the channel clock, it outputs a negative signal with a value corresponding to a value of the frequency error to the low pass filter 24 as the frequency error signal.

Then, the switch 25 turns on only when a synchronous leading-in is carried out, supplies the frequency error signal to the adder 22 and it turns off in order to improve a jitter characteristics when a synchronous lock is carried out.

The adder 22 adds the frequency error signal supplied only when the synchronous leading-in is carried out to a phase error signal and further outputs a signal obtained through adding operation to the loop filter 26.

The loop filter 26 restricts a high frequency component of the signal and outputs it to VCO 27. In this way, the loop filter 26 is highly delayed in its phase in a high region of PLL so as to prevent a positive feed-back from being applied and at the same time a component or noise of interference of codes contained in the reproduced signal is reduced. Then, VCO 27 oscillates the clock signal with a frequency corresponding to a voltage of the signal supplied from the loop filter 26 and outputs it as a PLL clock signal to the phase comparator 21 and the A/D converter 2 or the like.

As described above, the frequency error is calculated and added to the phase error, thereby the capture range is expanded in the digital PLL and a leading-in time can be shortened.

In addition, the aforesaid PLL circuit 4 is constituted by a digital circuit, although utilization of the D/A converter enables the low pass filter 24, the loop filter 26 and VCO 27 to become analogue circuits.

Additionally, a signal processing section such as a digital equalizing device may be arranged between the A/D converter 2 and the phase comparator 21.

In the aforesaid preferred embodiment, although the reproduced signal outputted by the reading device 1 is sampled, for example, it is also possible that the reproduced signal outputted from the receiving section for a predetermined digital data communication is sampled.

As described above, in accordance with the converter device described in claim 1 and the converting method described in claim 5, a predetermined analogue signal is sampled in synchronism with a clock signal, a phase error between a digital signal corresponding to the analogue signal and the lock signal is (calculated and at the same time a frequency error between the digital signal and the clock signal is calculated, the clock signal is generated in correspondence with a sum of the phase error and the frequency error, the digital signal is processed to output the digital data, so that the digital PLL circuit having a wide capture range and a short leading-in time is utilized to enable a conversion from the analogue signal to the digital data to be carried out.

In accordance with the PLL calculating device described in claim 6 and the PLL calculating method described in claim 9, a predetermined analogue signal is sampled in synchronism with the clock signal, a phase error between the digital signal corresponding to the analogue signal and the clock signal is calculated and at the same time a frequency error between the digital signal and the clock signal is calculated and the clock signal is generated in correspondence with a sum of the phase error and the frequency error, resulting in that it is possible to realize a digital PLL circuit in which a capture range under utilization of the frequency error is wide and the leading-in time is short.

What is claimed is:

1. A converter device in which an analogue signal transferred from a predetermined transferring medium is converted into a digital data, said converter device comprises:

sampling means for sampling said analogue signal in synchronism with a clock signal and outputting a digital signal corresponding to said analogue signal;

first calculating means for calculating a phase error between a digital signal outputted by said sampling means and said clock signal;

second calculating means for calculating a frequency error between said digital signal and the clock signal in reference to said phase error;

generating means for generating said clock signal in correspondence with a sum of said phase error and the frequency error; and processing means for processing said digital signal to generate said digital data.

2. The converter device according to claim 1, wherein said second calculating means calculates a code of said frequency error from an inclination direction of said phase error in a time axis and calculates a value of said frequency error in correspondence with the number of times in which a value of said phase error passes by a predetermined value.

3. The converter device according to claim 1, wherein said generating means generates said clock signal in correspondence with a sum of said phase error and frequency error and generates said clock signal in correspondence with said phase error during a synchronous locked state.

4. The converter device according to claim 1, wherein said analogue signal is an analocue signal sensed from a recording medium.

5. A converting method in which an analogue signal transferred from a predetermined transfer medium is converted into a digital data, wherein it is comprised of the steps of:

sampling said analogue signal in synchronism with a clock signal and outputting a digital signal corresponding to said analogue signal;

calculating a phase error between said digital signal and the clock signal;

calculating a frequency error between said digital signal and the clock signal in reference to said phase error;

generating said clock signal corresponding to a sum of said phase error and the frequency error; and processing said digital signal to generate said digital data.

6. A PLL calculating device comprised of:

sampling means for sampling an analogue signal in synchronism with a clock signal and outputting a digital signal corresponding to said analogue signal;

first calculating means for calculating a phase error between a digital signal outputted by said sampling means and said clock signal;

second calculating means for calculating a frequency error between said digital signal and the clock signal in reference to said phase error; and generating means for generating said clock signal in correspondence with a sum of said phase error and the frequency error.

7. A PLL calculating device according to claim 6, wherein said second calculating means calculates a code of said frequency error from a direction of inclination of said phase error at a time axis and calculates a value of said frequency error in correspondence with the number of times in which the value of said phase error passes by a predetermined value.

8. A PLL calculating device according to claim 6, wherein said generating means generates said clock signal in correspondence with a sum of said phase error and the frequency error and generates said clock signal in correspondence with said phase error during a synchronous locked state.

9. A PLL calculating method comprising the steps of:

sampling an analogue signal in synchronism with a clock signal and outputting a digital signal corresponding to said analogue signal;

calculating a phase error between said digital signal and the clock signal;

calculating a frequency error between said digital signal and the clock signal in reference to said phase error; and generating said clock signal in correspondence with a sum of said phase error and the frequency error.

* * * * *